United States Patent
Benedix et al.

(10) Patent No.: US 6,556,496 B2
(45) Date of Patent: Apr. 29, 2003

(54) SEMICONDUCTOR CONFIGURATION WITH OPTIMIZED REFRESH CYCLE

(75) Inventors: Alexander Benedix, München (DE); Roland Barth, München (DE); Stephan Grosse, München (DE); Reinhard Dueregger, Poing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/941,902

(22) Filed: Aug. 29, 2001

(65) Prior Publication Data

US 2002/0080673 A1 Jun. 27, 2002

(30) Foreign Application Priority Data

Aug. 29, 2000 (DE) .......................................... 100 42 383

(51) Int. Cl.$^7$ ................................................. G11C 7/00
(52) U.S. Cl. .......................... 365/222; 365/211; 365/52
(58) Field of Search .................................. 365/222, 211, 365/233, 230.02, 191, 230.06, 52

(56) References Cited

U.S. PATENT DOCUMENTS

| | | | | |
|---|---|---|---|---|
| 5,278,796 | A | | 1/1994 | Tillinghast et al. .......... 365/211 |
| 5,495,452 | A | * | 2/1996 | Cha ............................ 365/222 |
| 5,539,703 | A | | 7/1996 | Manning ..................... 365/222 |
| 6,021,076 | A | * | 2/2000 | Woo et al. ................... 365/211 |
| 6,038,187 | A | * | 3/2000 | El Hajji ....................... 365/222 |
| 6,084,812 | A | * | 7/2000 | Joo .............................. 365/222 |
| 6,141,280 | A | * | 10/2000 | Cho ............................. 365/222 |
| 6,229,747 | B1 | * | 5/2001 | Cho et al. .................... 365/222 |
| 6,233,190 | B1 | * | 5/2001 | Cooper et al. ............... 365/212 |

* cited by examiner

*Primary Examiner*—Hoai Ho
*Assistant Examiner*—Gene N. Auduong
(74) *Attorney, Agent, or Firm*—Laurence A. Greenberg; Werner H. Stemer; Gregory L. Maybeck

(57) ABSTRACT

A semiconductor configuration is described and has a temperature sensor, which measures a temperature of a semiconductor module. The measured temperature is provided to a control unit, so that the control unit can adapt a refresh cycle in the semiconductor module to the retention time corresponding to the measured temperature.

8 Claims, 1 Drawing Sheet

SEMICONDUCTOR CONFIGURATION WITH OPTIMIZED REFRESH CYCLE

BACKGROUND OF THE INVENTION

Field of the Invention

The present invention relates to a semiconductor configuration having a control unit, which subjects a semiconductor module of the semiconductor configuration to a refresh cycle with a refresh time which is set in such a way that, at the highest semiconductor module temperature to be expected, the retention time of the semiconductor module is longer than the refresh time. Such a semiconductor module is preferably a dynamic random access memory (DRAM).

In the case of a DRAM as an example of a volatile semiconductor memory, the internal time constant thereof, the so-called retention time, specifies the time duration within which the individual memory cells of the DRAM must he subjected to a refresh in order to avoid a loss of data. In this case, the refresh time must be shorter than the retention time.

In the case of a DRAM, then, the retention time of its memory cell is greatly influenced by the temperature. In other words, the retention time is shorter, the higher the temperature of the DRAM.

As is known, however, DRAMs are used in a very broad temperature range. In order to avoid a loss of data in all cases, the refresh cycle in the case of DRAMs is therefore set in such a way that, at the highest temperature to be expected, that is to say 70° C. for example, the retention time is longer than the refresh time. A suitable value for the refresh time for this purpose is 64 ms, for example. Such a refresh time ensures that even at high temperatures of the order of magnitude of 70° C., the retention time is longer than the refresh time, as a result of which the loss of data can be avoided.

If a DRAM is operated at temperatures, which are lower than the maximum temperature to be expected of 70° C., for example, then the memory cells of the DRAM are subjected to a refresh more often than would actually be necessary. In other words, the current consumption of the DRAM is increased and the system performance of the DRAM is reduced.

SUMMARY OF THE INVENTION

It is accordingly an object of the invention to provide a semiconductor configuration with an optimized refresh cycle that overcomes the above-mentioned disadvantages of the prior art devices of this general type, in which the refresh cycle is adapted to the actual requirement necessary for the data refresh.

With the foregoing and other objects in view there is provided, in accordance with the invention, a semiconductor configuration containing a semiconductor module having housing pins and a control unit connected to the semiconductor module and subjecting the semiconductor module to a refresh cycle with a refresh time set such that, at a highest semiconductor module temperature to be expected, a retention time of the semiconductor module is longer than the refresh time. A temperature sensor is disposed in the semiconductor module and is connected to one of the housing pins. The temperature sensor measures a temperature of the semiconductor module and reports the temperature to the control unit. The control unit adapting the refresh time of the refresh cycle to the retention time expected for the semiconductor module at the temperature measured.

In the case of a semiconductor configuration of the type mentioned in the introduction, the object is achieved according to the invention by a temperature sensor which is provided in the semiconductor module and adapts the refresh time of the refresh cycle, depending on the measured semiconductor module temperature, to the retention time expected for the measured semiconductor module temperature.

With the temperature sensor for determining the temperature of the semiconductor module, that is to say in particular the DRAM, the present invention takes a completely different path from the previous concept. The refresh cycle supplied by refresh generators is no longer adapted to the highest temperature to be expected in order to ensure in all cases that the refresh time is shorter than the retention time. Rather, the actual temperature of the module is measured by the temperature sensor. The actual temperature is assigned a retention time, which, at customary or low temperatures, is always longer than the retention time at the highest temperature to be expected. The refresh cycle is then chosen in such a way that the refresh time is still just shorter than the retention time at the measured temperature. In this way, the refresh can be adapted to the actual requirement in an optimum manner in order to avoid a loss of data, which would occur if the retention time were shorter than the refresh time.

A development of the invention provides for the temperature sensor to be connected to a previously unused housing pin of the semiconductor module. However, it is also possible for the temperature sensor to be connected to an already used housing pin by a multiplexer circuit. Such an already used housing pin may be, for example, the pin for a DQ standard signal.

It has been shown that, in the case of a DRAM for example, the retention time of its memory cells is halved in the case of a temperature increase approximately every 15 to 20° K. It follows from this to a first approximation that when the chip temperature of a DRAM is reduced by 15 to 20° K., the current required for the data refresh is likewise approximately halved.

The present invention can thus improve the system performance especially at lower temperatures of distinctly below 70° C. by virtue of the refresh times that become longer or by virtue of the refresh commands that are necessary less often.

In accordance with an added feature of the invention, an access control circuit is connected to and controls the multiplexer circuit.

In accordance with an additional feature of the invention, a self-refresh oscillator and a self-refresh control circuit are connected between the temperature sensor and the self-refresh oscillator.

In accordance with a further feature of the invention, the self-refresh oscillator and the self-refresh control circuit are disposed in the semiconductor module.

In accordance with a concomitant feature of the invention, the self-refresh oscillator and the self-refresh control circuit are disposed in the control unit.

Other features which are considered as characteristic for the invention are set forth in the appended claims.

Although the invention is illustrated and described herein as embodied in a semiconductor configuration with an optimized refresh cycle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
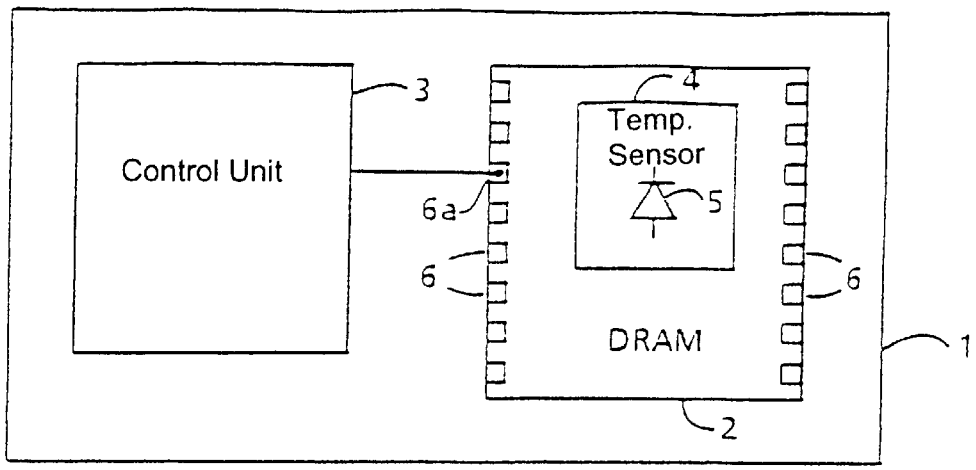
FIG. 1 is a block diagram for elucidating a first exemplary embodiment of a semiconductor configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor configuration 1 containing a semiconductor module 2, which in this case is a DRAM, which has a multiplicity of pins or terminals 6. The semiconductor module 2 is connected to a control unit 3, which serves to control the semiconductor configuration 1.

The semiconductor module 2 contains a temperature sensor 4 containing, for example, a temperature-dependent diode 5. The temperature sensor 4 is connected to the control unit 3 via a previously unused pin or terminal 6a.

The temperature sensor 4 reports the temperature of the semiconductor module or DRAM 2 to the control unit 3 via a pin 6a. Depending on the reported temperature, the control unit 3 then defines the refresh cycle of the semiconductor module or DRAM 2 in such a way that the refresh time is somewhat shorter than the retention time, corresponding to the temperature ascertained, in the semiconductor module or DRAM 2. As a result, the refresh time can be defined in such a way that it is adapted to the retention time of the semiconductor module or DRAM 2 and is not unnecessarily long.

Figure 2:
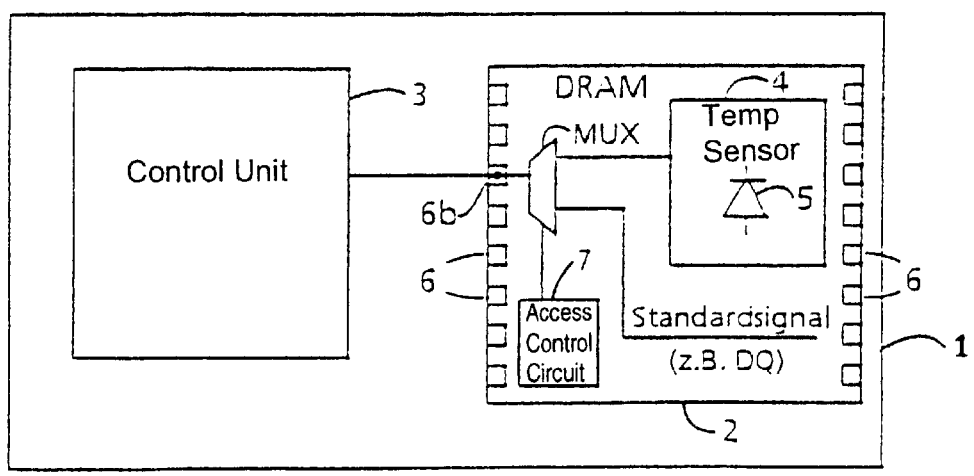
FIG. 2 is a block diagram for elucidating a second exemplary embodiment of the semiconductor configuration.

FIG. 2 shows a further exemplary embodiment of the semiconductor configuration according to the invention. An already used pin or terminal 6b is used here instead of a previously unused terminal 6a in accordance with the exemplary embodiment of FIG. 1. A standard signal, for example the "DQ" signal, is normally present at the terminal 6b.

In order, then, to ensure interference-free transfer of the data from the temperature sensor 4 to the control unit 3, a multiplexer MUX is provided, into whose inputs the temperature signal from temperature sensor 4 and the standard signal are fed and which is controlled by an access control circuit 7. The access control circuit 7 causes the multiplexer MUX, as required, to cause the pin 6b to transfer the temperature signal from the temperature sensor 4 or the standard signal DQ to the control unit 3.

The invention enables optimum adaptation of the refresh time to the retention time actually present, with the result that short refresh times, as are necessary at high temperatures of the semiconductor module, can be largely avoided. The refresh frequency can thus be reduced, which entails a reduction of the required current necessary for the refresh.

Figure 3:
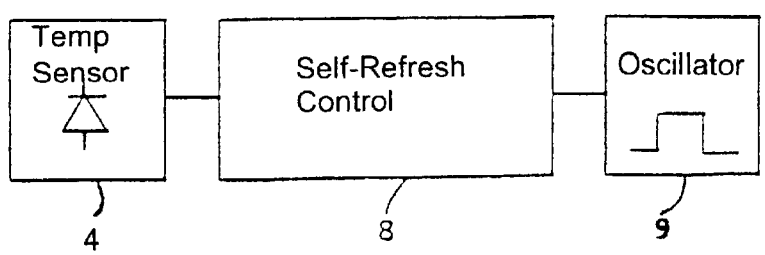
FIG. 3 is a block diagram for a connection of a self-refresh oscillator to a temperature sensor.

FIG. 3 shows a block diagram with the temperature sensor 4 and a self-refresh control 8, which reads the temperature sensor 4 and controls a self-refresh oscillator 9 depending on specifications, which are input into the control 8 and may be supplied by the control unit 3. The control 8 and the self-refresh oscillator 9 may be accommodated together with the temperature sensor 4 in the semiconductor module 2 or else be provided separately from the latter for example in the control unit 3.

We claim:

1. A semiconductor configuration, comprising:

a semiconductor module having housing pins;

a control unit connected to said semiconductor module and subjecting said semiconductor module to a refresh cycle with a refresh time set such that, at a highest semiconductor module temperature to be expected, a retention time of said semiconductor module is longer than the refresh time; and a temperature sensor disposed in said semiconductor module and connected to one of said housing pins, said temperature sensor measuring a temperature of said semiconductor module and reporting the temperature to said control unit, said control unit adapting the refresh time of the refresh cycle to the retention time expected for said semiconductor module at the temperature measured.

2. The semiconductor configuration according to claim 1, wherein said semiconductor module is a dynamic random access memory.

3. The semiconductor configuration according to claim 1, wherein said temperature sensor is connected to an unused one of said housing pins of said semiconductor module.

4. The semiconductor configuration according to claim 1, including a multiplexer circuit connected to said temperature sensor and to a used one of said housing pins.

5. The semiconductor configuration according to claim 4, including an access control circuit connected to and controlling said multiplexer circuit.

6. The semiconductor configuration according to claim 1, including:

a self-refresh oscillator; and a self-refresh control circuit connected between said temperature sensor and said self-refresh oscillator.

7. The semiconductor configuration according to claim 6, wherein said self-refresh oscillator and said self-refresh control circuit are disposed in said semiconductor module.

8. The semiconductor configuration according to claim 6, wherein said self-refresh oscillator and said self-refresh control circuit are disposed in said control unit.

* * * * *